US010853530B2

(12) United States Patent
Alenius et al.

(10) Patent No.: US 10,853,530 B2
(45) Date of Patent: Dec. 1, 2020

(54) SYSTEM FOR SYSTEMATIC SELECTION OF VEHICLE SPECIFICATION

(71) Applicant: Scania CV AB, Södertälje (SE)

(72) Inventors: Mikael Alenius, Segeltorp (SE); Johan Wängdahl, Älvsjö (SE); Erik Dahlberg, Ekerö (SE)

(73) Assignee: SCANIA CV AB (SE)

( * ) Notice: Subject to any disclaimer, the term of this patent is extended or adjusted under 35 U.S.C. 154(b) by 1101 days.

(21) Appl. No.: 14/436,520

(22) PCT Filed: Oct. 17, 2013

(86) PCT No.: PCT/SE2013/051211
§ 371 (c)(1),
(2) Date: Apr. 17, 2015

(87) PCT Pub. No.: WO2014/062126
PCT Pub. Date: Apr. 24, 2014

(65) Prior Publication Data
US 2015/0254395 A1   Sep. 10, 2015

(30) Foreign Application Priority Data
Oct. 17, 2012   (SE) ...................... 1251175

(51) Int. Cl.
G06F 30/15   (2020.01)
G06Q 30/02   (2012.01)
(Continued)

(52) U.S. Cl.
CPC .............. *G06F 30/15* (2020.01); *G06F 17/10* (2013.01); *G06Q 30/02* (2013.01); *G06Q 30/0621* (2013.01)

(58) Field of Classification Search
CPC . G06F 17/5095; G06F 17/10; G06Q 30/0621; G06Q 30/02
(Continued)

(56) References Cited

U.S. PATENT DOCUMENTS 4,207,610 A * 6/1980 Gordon ................ G01R 31/007
324/503
5,717,595 A * 2/1998 Cherrington .......... G01M 15/05
700/90
(Continued)

FOREIGN PATENT DOCUMENTS

JP   H05-079949 A   3/1993
JP   2002-297696 A   10/2002
(Continued)

OTHER PUBLICATIONS

DHS publication (Guide to Active Vehicle Barrier (AVB) Specification and Selection Resources, pp. 1-72, 2014) (Year: 2014).*
(Continued)

Primary Examiner — Iftekhar A Khan
(74) Attorney, Agent, or Firm — Ostrolenk Faber LLP

(57) ABSTRACT

A system to carry out a systematic selection of a specification for a first vehicle. The specification includes several parameters related to at least one characteristic for the first vehicle. The system includes a collection device for collection of operational data from at least one other vehicle. The operational data comprises information about how the at least one other vehicle has been used. A simulation device simulates how an adjustment of at least one of the several parameters impacts the at least one characteristic for the first vehicle. The simulation being based on the operational data. Also, selection device selects at least one specification based on the simulation.

14 Claims, 3 Drawing Sheets

(51) Int. Cl.
*G06F 17/10* (2006.01)
*G06Q 30/06* (2012.01)

(58) Field of Classification Search
USPC .............................................................. 703/1
See application file for complete search history.

(56) References Cited

U.S. PATENT DOCUMENTS

| | | | | |
|---|---|---|---|---|
| 6,246,942 B1* | 6/2001 | Dobler | ................ | F16H 61/0213 477/110 |
| 6,944,515 B2* | 9/2005 | Nakajima | .............. | G06Q 10/06 700/105 |
| 7,444,195 B2* | 10/2008 | Smith | ...................... | G06F 30/15 700/97 |
| 7,447,616 B2* | 11/2008 | Wang | ...................... | G06F 30/15 703/8 |
| 7,647,210 B2* | 1/2010 | Wang | ...................... | G06F 30/15 703/1 |
| 7,844,622 B1* | 11/2010 | Lackey | .................. | G06Q 10/06 707/769 |
| 7,853,391 B2* | 12/2010 | Komeda | .............. | B60W 40/10 340/463 |
| 7,874,078 B2* | 1/2011 | Harrill | ................... | G01B 11/16 33/288 |
| 7,908,123 B2* | 3/2011 | Maebayashi | ........... | G06Q 10/06 703/1 |
| 8,412,367 B2* | 4/2013 | Mahaffy | ............ | G05B 19/4097 700/98 |
| 8,818,543 B2* | 8/2014 | Sohmshetty | ............ | G06F 30/15 700/98 |
| 8,825,460 B2* | 9/2014 | Walenta | .................. | G06F 30/15 703/8 |
| 8,939,869 B2* | 1/2015 | Fuke | ....................... | F02D 29/02 477/111 |
| 9,009,013 B2* | 4/2015 | Krainz | ................... | G05B 17/02 703/13 |
| 9,070,298 B2* | 6/2015 | Kiridena | ................. | G09B 9/05 |
| 9,208,626 B2* | 12/2015 | Davidson | ........... | G06Q 10/0631 |
| 9,317,983 B2* | 4/2016 | Ricci | ......................... | G06F 16/25 |
| 9,910,433 B1* | 3/2018 | Golden | .................. | B61L 25/00 |
| 2002/0178080 A1* | 11/2002 | Ly | ...................... | G06Q 30/0621 705/26.5 |
| 2003/0055674 A1* | 3/2003 | Nishiyama | .............. | G06Q 10/06 703/8 |
| 2003/0115037 A1* | 6/2003 | Sumida | .................. | G05B 17/02 703/22 |
| 2003/0130989 A1* | 7/2003 | Kaufman | ............... | G06Q 30/02 |
| 2004/0010398 A1* | 1/2004 | Noma | ................... | G06F 30/15 703/1 |
| 2004/0064337 A1* | 4/2004 | Nakahara | ............. | G08G 1/0104 701/33.4 |
| 2005/0004738 A1* | 1/2005 | Gronau | ............... | B60T 8/17554 701/70 |
| 2005/0021222 A1* | 1/2005 | Minami | ............... | G07C 5/0858 701/123 |
| 2005/0216152 A1* | 9/2005 | Tsubota | ................. | G06Q 10/06 701/29.1 |
| 2006/0148615 A1* | 7/2006 | Steen | .................... | B60W 30/18 477/111 |
| 2007/0073526 A1* | 3/2007 | Maebayashi | ........... | G06Q 10/06 703/8 |
| 2007/0143195 A1* | 6/2007 | Bell | ........................ | G06Q 40/02 705/35 |
| 2007/0256481 A1* | 11/2007 | Nishiyama | ................ | G01F 9/02 73/114.52 |
| 2008/0161991 A1* | 7/2008 | Hatori | ................... | G01M 17/06 701/29.1 |
| 2009/0203481 A1* | 8/2009 | Nohara | .................. | B60K 6/547 475/150 |
| 2011/0106405 A1* | 5/2011 | Dulzo | ................... | F02D 41/221 701/103 |
| 2011/0137508 A1* | 6/2011 | Garcia Manchado | ...................... | G01C 21/34 701/31.4 |
| 2011/0184642 A1* | 7/2011 | Rotz | .................. | G01C 21/3469 701/533 |
| 2012/0173096 A1* | 7/2012 | Swartling | ............. | B60W 30/19 701/51 |
| 2013/0158838 A1* | 6/2013 | Yorke | ............. | B60W 30/18018 701/103 |

FOREIGN PATENT DOCUMENTS

| | | |
|---|---|---|
| WO | WO 99/61301 A1 | 12/1999 |
| WO | WO 2011/035427 A1 | 3/2011 |
| WO | WO-2014062126 A1 * | 4/2014 ............. G06Q 30/02 |

OTHER PUBLICATIONS

Wang et al. ("Construction of knowledge based engineering platform for armored vehicle", IEEE,2009, pp. 1052-1056) (Year: 2009).*

Chen et al. ("Enabling collaborative product design through distributed engineering knowledge management", Computers in Industry 59 (2008) 395-409) (Year: 2008).*

International Search Report dated Feb. 28, 2014 in corresponding PCT International Application No. PCT/SE2013/051211.

Korean Office Action for Korean Patent Application No. 10-2015-7013056 dated Mar. 16, 2016 with English translation.

* cited by examiner

SYSTEM FOR SYSTEMATIC SELECTION OF VEHICLE SPECIFICATION

CROSS-REFERENCE TO RELATED APPLICATIONS

The present application is a 35 U.S.C. §§ 371 national phase conversion of PCT/SE2013/051211, filed Oct. 17, 2013, which claims priority of Swedish Patent Application No. 1251175-4, filed Oct. 17, 2012, the contents of which are incorporated by reference herein. The PCT International Application was published in the English language.

TECHNICAL FIELD

The present invention pertains to a system for the systematic selection of specifications, and a computer program and a computer program product, which implement the method.

BACKGROUND

FIG. 1 shows a schematic view of an example vehicle 100, which may be a car, a truck or a bus. The vehicle has a driveline comprising one combustion engine 101, which in a customary manner, via an output shaft 102 on the combustion engine 101, usually via a flywheel, is connected to an input shaft 109 in a gearbox 103 via a clutch 106. The clutch 106 may consist of an automatically controlled clutch, and be controlled by the vehicle's control system via a control device 400 (FIG. 4). The control device 400 may also control the gearbox 103. The gearbox 103 is illustrated schematically as one device. However, the gearbox 103 may also physically consist of several cooperating gearboxes, for example, a so-called range gearbox, a main gearbox and a split gearbox, which are arranged along the vehicle's driveline. The gearbox may comprise a suitable number of gears. Today's gearboxes for heavy goods vehicles usually have twelve forward gears, two reverse gears and one neutral gear. An aftertreatment system 200 purifies the exhausts from the combustion engine 101. The vehicle's driveline further comprises drive shafts 104, 105, which are connected to the vehicle's driving wheels 110, 111, and which are driven by an output shaft 107 from the gearbox 103, via a shaft gear 108, such as a customary differential shaft. The driveline thus comprises the engine 101, the output shaft 102, the clutch 106, the input shaft 109, the gearbox 103, the output shaft 107 and the shaft gear 108.

The vehicle 100 further comprises various different braking systems, such as a customary braking system, which may comprise brake plates with associated brake pads (not shown) arranged next to each wheel. The engine 101 may be controlled based on instructions from a cruise control, or by a driver of the vehicle.

Today's motor vehicles, comprising vehicles driven by combustion engines, hybrid electric vehicles and electric vehicles, have a large number of different characteristics which may be selected to suit a driver and/or an owner of the vehicle. For example, the buyer of a vehicle must select the type of fuel (for example diesel, petrol, gas, ethanol or electric power) with which the vehicle is driven, the engine power of the vehicle, the type of gearbox 103 which the vehicle will have, the type of clutch 106 which the vehicle will have, the type of gearing which the back shaft 108 will have, the type of brake system with which the vehicle will be equipped, the type of turbo charger which the vehicle will have, the type of wheels 111, 112, 113, 114 which the vehicle will have, the type of distribution gearbox that the vehicle will have, which determines how power is distributed among front and rear shafts, and the type of aftertreatment system for exhaust purification 200 which the vehicle should have. The above exemplified characteristics only constitute a part of all the characteristics which a vehicle may have, which should be clear to a person skilled in the art.

BRIEF DESCRIPTION OF THE INVENTION

Since there are so many different characteristics which must be selected when ordering and/or purchasing a new vehicle, the choice of a new vehicle becomes very difficult for the buyer. Thus, there is a risk that the choice of vehicle results in a vehicle with characteristics which are not optimal for the new owner's use of the vehicle. Suboptimal choices when ordering and/or purchasing vehicles may have a negative impact on, for example, the vehicle's total cost, the vehicle's fuel consumption and the vehicle's comfort for the driver.

For a hauling company, apart from the cost of acquisition of the vehicle, the main expenditure items for the day-to-day operation of a vehicle consist of the vehicle's driver's salary, costs of repair and maintenance and fuel for the propulsion of the vehicle. The fuel cost may impact the profitability for the hauling company to a very great extent, and should therefore be kept as low as possible. If, for example, the types of engine, gearing and wheels are selected so that they are well adjusted to the future use of the vehicle, the fuel costs may be minimised. A vehicle which is well adapted to its use will also generate less repair costs.

By using prior art solutions, specifications for the new vehicle have often not been optimised for the vehicle's future use, which has led to an unnecessarily high total cost of the vehicle One objective of the present invention is therefore to provide systematically produced vehicle specifications, which means that a more optimal choice of a vehicle may be made when ordering and/or purchasing a vehicle, so that the total cost of the vehicle and also the driver comfort may be significantly improved.

This objective is achieved through the above mentioned system. The objective is also achieved through the above mentioned computer program and computer program product.

By using the present invention, regard may be had to a large number of parameters which are related to various vehicle characteristics when the vehicle specification is prepared, which provides a much more reliable production of the vehicle specifications.

By then carrying out one or several simulations of how an adjustment of one or several of these parameters impacts the characteristic itself of the vehicle, for example, a seller may easily and comprehensively explain to the client how the choice of the different parameters will impact the driving experience and/or the total cost of the vehicle.

According to the present invention, the one or several simulations are based on operating data which has been stored in one or several vehicles when these have been operational. Therefore, if the present invention is used, a hauling company or a vehicle owner who has previously used one or several vehicles on a certain route or along a route similar to this certain route may, for example, use operating data from these vehicles if the vehicle which is to be ordered and/or purchased will be used on the same route. Similarly, a client and/or a buyer may also use operating data from vehicles owned by other persons and/or companies, which use the vehicles for this route, or a similar route. Potentially, the use of operating data from vehicles owned by others may require a permission of some kind from the other vehicle owner.

Since operating data for a certain route comprise many different types of information, such as speed limits on the route, topography for the route, road conditions for the route and driving resistance for the route, which may be used for the present invention in the one or several simulations, through the use of the present invention, very detailed and optimised vehicle specifications may easily be produced by the system for systematic selection of vehicle specifications.

With the present invention, significantly more parameters and also significantly more relevant values for these parameters will be used when the vehicle specifications are produced, than with prior art solutions. This means that when the vehicle specifications are produced through the use of the present invention the reliability becomes very good.

The present invention may also be used by a seller to create confidence among customers, since the seller will be perceived by the customers as interested and well informed if the seller is able to prove to customers that he knows how the customers use their vehicles.

It may often be a sensitive subject if a seller asks customers how they use their vehicles. It is also common that the customers do not know in any detail how their vehicles are used. The seller may thus, by using the present invention, be assisted in increasing his customer knowledge significantly. It is often decisive for a seller to build up a network of contacts with customers who have confidence in him. In order to do so, it is important to know how they drive and how they want to use their vehicles in order to sell the right cars to them.

The present invention may also be used to streamline the selling process. Because of lack of adequate time, sellers have previously often found the selling process difficult. Through the invention, the sellers may, with, for example, the use of a chassis number and/or a registration number, make simulations and/or optimisations directly, resulting in vehicle specifications. The time-consuming administration previously required by the seller during the selling process, which among others entailed interaction with the buyer, may therefore be minimised.

BRIEF DESCRIPTION OF FIGURES

The invention will be illustrated in more detail below, along with the enclosed drawings where similar references are used for similar parts, and where.

Figure 1:
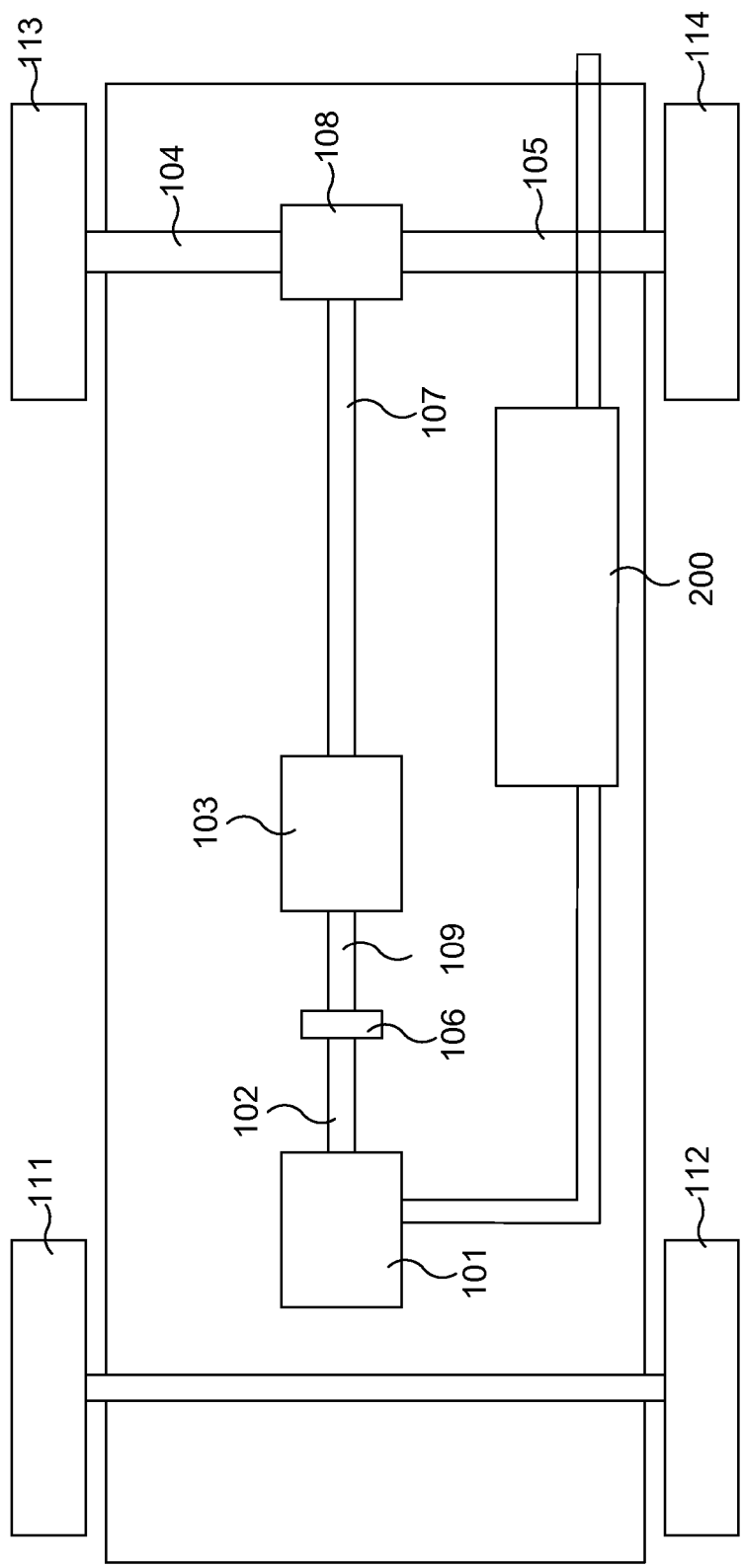
FIG. 1 shows a schematic view of an example vehicle.

DESCRIPTION FO PREFERRED
EMBODIMENTS

The present invention provides a system arranged to carry out a systematic selection of a specification for a first vehicle. The term "arranged for" as used in this document comprises the terms "adapted for" and "installed for". These vehicle specifications comprise a number of parameters related to at least one characteristic for the first vehicle. Typically, the present invention may thus be used when an order and/or purchase of a vehicle is to be made to have the characteristics requested by the buyer, since vehicle specifications are necessary for the newly built vehicle which is to be ordered, or the used vehicle which is to be purchased. The present invention may, however, also be used in other situations where simulations of vehicle characteristics based on a number of parameters obtained from operational data are carried out.

The system according to the invention comprises a collection device, a simulation device and a selection device. The collection device is arranged to collect operational data from at least one other vehicle. These operational data comprise information about how the at least one other vehicle has been used before the collection. Such operational data is often stored in today's vehicles while they are driven. Operational data may be provided to the collection device either directly from the at least one other vehicle, or may be stored in the interim in some form of a database. A database may in this case comprise essentially all suitable devices in which data may be stored, such as a server, a computer, a database, a register or a similar storage device. Thus, the system according to the invention may collect operational data suitable for use in the preparation of the vehicle specifications.

According to one embodiment of the invention, operational data from more than one vehicle is used, so that the statistical reliability increases. Thus, operational data from several vehicles on a certain route may be collected and used by the system to reduce the risk of one driver's personal driving style rendering the operational data of his/her vehicle unrepresentative of the operational data of a vehicle driven by an average driver. Thus, through this embodiment, vehicle specifications are obtained, which should be generally applicable to several drivers.

The system according to the present invention further comprises a simulation device, which is arranged to simulate how an adjustment of at least one of the parameters impacts the at least one characteristic for the first vehicle. This simulation device is, according to the present invention, installed to carry out the simulation based on operational data.

The system according to the present invention further comprises a selection device which is arranged to select at least one vehicle specification. This selection is made according to the invention based on the simulation. Thus, a systematic selection of vehicle specifications is achieved based on operational data from the at least one other vehicle, which means that very reliable vehicle specifications are obtained which have been built up based on a number of parameters impacting the vehicle characteristics.

According to one embodiment of the invention, the system is arranged to select the at least one second vehicle, so that the at least one second vehicle has been used in an essentially similar manner as planned for the first vehicle. In other words, the system here chooses to base the preparation of the vehicle specifications on other vehicles, which with high probability produces vehicle specifications that are well adjusted to the first vehicle's future use. For example, the at least one second vehicle may be selected so that it has been driven on one or several routes on which the first vehicle is planned to be driven. The at least one second vehicle may also be selected, so that it has been driven on one or several routes which in one or several respects are similar to the one or several routes on which the first vehicle is planned to be driven. Thus, vehicle specifications may be obtained which are tailored, i.e. directly adjusted for, future use of the first vehicle, providing a low total cost for the vehicle and at the same time a good driver comfort.

According to one embodiment of the present invention, operational data from the other vehicle may be corrected before simulations are made based on these operational data. For example, the torque value in a load matrix may be corrected to higher values if the first vehicle will have a heavier load than the second vehicle when the operational data was saved. Similarly, for example, torque values in the load matrix may be corrected to lower values if the first vehicle will have a lighter load than the second vehicle. Load/vehicle load in this document means the mass or weight for the items transported by the vehicle. In other words, the load/vehicle load is, for example, related to the items in the vehicle's trunk or on the vehicle's loading platform.

According to one embodiment of the present invention, the collection device comprises a receiving device, an identification device and a collection device. The receiving device is arranged to receive an input of identification information for the at least one second vehicle. This identification information may typically be a chassis number, registration number, or some other information which is suitable for the purposes of vehicle identification. The identification device is arranged to identify the at least one second vehicle based on the identification information, following which the collection device is arranged to collect operational data for the identified vehicle.

For example, one or several registration numbers for one or several vehicles, which a client and/or buyer and/or seller knows or believes have suitable operational data, may be fed into the system's receiving device. Typically, clients and/or buyers may specify a registration number of one of their previous vehicles, which the client and/or buyer knows has been used in a similar manner as the new vehicle. The registration number for that vehicle will be used by the system to obtain its operational data to determine the vehicle specifications.

Once operational data have been collected from one or several suitable vehicles, different simulations may be carried out based on these operational data, for which one or several parameter values is changed. These different simulations may then be compared with each other and/or used to see what impact the adjustment of parameter values will have on the vehicle's characteristics, and suitable vehicle specifications may be selected systematically.

More specifically, the simulation device is installed for this embodiment by calculating a first simulation value through a first simulation based on operational data and on at least one first parameter value for at least one of several parameters. This at least one first parameter value is here related to a first vehicle specification. The simulation device is also installed to calculate a second simulation value through a second simulation based on the operational data and on at least one second parameter value for at least one of several parameters, where the second parameter value is related to a second vehicle specification.

A comparing device then compares the first and the second simulation values, following which an indication is provided as to whether the first vehicle specification or the second vehicle specification is suitable. The suitable vehicle specifications may thus be provided based on a comparison of the first and the second simulation values.

According to one embodiment of the invention, several vehicle specifications may be indicated as suitable. A number of other simulation values are comprised in the at least one second simulation value, where each one of these several second simulation values is calculated based on the respective at least one second parameter value. The comparing device then compares the first simulation value with these several second simulation values. Subsequently, a predetermined number of vehicle specifications are identified as potentially suitable vehicle specifications based on the comparison. An indication of this predetermined number of potentially suitable vehicle specifications is then provided.

According to one embodiment of the invention, the first and the at least one second simulation value are related to fuel consumption. Thus, the comparing device here decides a difference in fuel consumption which results from the adjustment of the parameter, i.e. the difference in fuel consumption between the first and the second simulation. Since the first and the second simulations are related to a first and a second vehicle specification, respectively, the comparison will also indicate a difference in fuel consumption for each vehicle specification for the operational data which is used in the simulations. The difference in fuel consumption may be indicated in a number of different ways, for example, as a percentage, as litres per 100 km, as energy or as carbon dioxide emissions. Since fuel consumption is important both to the vehicle's total cost and to the environment, the difference in fuel consumption for the different vehicle specifications may be an important factor in the selection of a vehicle.

According to one embodiment of the invention, the first and the at least one other simulation values are related to the driveability of the vehicle, such as average speed, driving time, or duration with maximum torque. Thus, the comparing device determines a difference in driveability between the first and the second vehicle specifications since these are related to the first and the second simulations. Driveability is often an important factor for a client and/or buyer of a vehicle, and is often weighed against fuel consumption for the vehicle.

According to one embodiment of the invention, the first and the at least one second simulation values are, for example, related to the life of a component, where the component may consist of one or several of the gearbox 103, the rear shaft 104, 105, 108, engine 101, the clutch 106, the generator and/or the battery, the retarder, and one or several brakes in a brake system. Engine torque and speed as well as time spent per revolution may here be used to determine a probable life for these components. Thus, the comparing device determines a difference in component life between the first and the second vehicle specifications, since these are related to the first and the second simulations, respectively.

According to one embodiment of the invention, the first and the at least one second simulation values are related to a spring stiffness and/or a stabiliser bar in the vehicle. Spring stiffness and/or stabiliser bars are often important factors, which indicate the vehicle's behavior in different driving situations. The determination of simulation values for the spring stiffness and/or stabiliser bar uses information from an accelerometer which is suitably mounted in the vehicle. The service life, i.e. the fatigue, of the spring stiffness and/or stabiliser bar may also be determined here if the vehicle is equipped with an accelerometer.

According to one embodiment of the invention, the first and the at least one second simulation values are related to an energy storage. In this document, the term energy storage comprises essentially all devices which may store some sort of energy, such as a battery or a capacitor, which may be loaded and store electric energy, a flywheel, which comprises a mass that may be set in rotation so that rotation energy is stored as the rotating mass, or a rubber band, which is untwisted to be able to emit the energy when the rubber band reverts to its original position. Energy may here be stored when braking in order to later be used in subsequent accelerations, which is typically used in, for example, hybrid cars.

According to the embodiment, the comparing device thus determines the difference in energy storage between the first and the second vehicle specifications, since these are related to the first and the second simulation, respectively, or the comparing device determines at least whether there is a potential gain in energy storage. A potential gain in energy storage depends on how the second vehicle has been driven. Generally, a large quantity of energy may be stored and recycled if a lot of braking is done. However, despite this it may be more energy efficient to drive the vehicle with less braking. At least the number and the length of brakings and their suitability should be taken into consideration when the potential gain in energy storage is determined.

As mentioned above, operational data which are used in the systematic selection of vehicle specifications according to the present invention may be provided to the collection device in the system directly from at least one other vehicle, or provided to the collection device from a database, which is arranged to store operational data from the at least one other vehicle.

Each one of the parameters which is used in the simulations according to the present invention may, for example, be related to the one or several vehicle characteristics of: a gearing for a rear shaft, a gearbox, an engine, a clutch, a brake system, a turbocharger, a wheel type, a distribution a gearbox, a battery, and an exhaust purification system. Thus, a simulation where one parameter is related to a rear shaft gearing may be adjusted to determine how this affects the rear shaft gearing specifically. Similarly, adjustments of parameters related to the gearbox, the engine, the clutch, the brake system, the turbocharger, the wheel type, the distribution gearbox, the battery, or the exhaust purification system may be used to simulate how the characteristics for the gearbox, the engine, the clutch, the brake system, the turbocharger, the wheel type, the distribution gearbox, the battery, and the exhaust purification system are impacted by the adjustment. Thus, vehicle specifications comprising a number of such parameters may be prepared with the use of the present invention, where these parameters have been adjusted so that the vehicle characteristics are those desired by clients and/or buyers.

Above is a description of how operational data may be used in a systematic preparation of vehicle specifications through the use of the present invention. Operational data may comprise information related to a number of different parts of the other vehicle.

Operational data may comprise a utilisation period for the respective at least one gear in the gearbox 103 in the at least one other vehicle. Thus, the operational data here specify which gears have been used and how long the different gears have been used in the at least one other vehicle. Operational data for the utilisation period for the gears may, according to one embodiment, be stored in connection with the gearbox 103 in the at least one other vehicle. Operational data for the utilisation period for the gears may, according to one embodiment, also be calculated, for example, based on a load matrix, which comprises values corresponding to time periods when the at least one other vehicle has used different/certain revolutions, such as engine speeds, and different/certain torques, such as engine torque. According to one embodiment, operational data are thus provided to the system according to the present invention in the form of at least one load matrix, where the at least one load matrix comprises values corresponding to time periods during which the at least one other vehicle has used different/certain engine speeds and different/certain engine torques. Typically, the engine speeds and the engine torque are used in the load matrix, but a person skilled in the art will realize that engine speeds and the torque for other suitable parts of the driveline may also be used, for example, the input shaft 109 of gearbox 103.

According to one embodiment, in the systematic preparation of the vehicle specifications, the at least one load matrix is used in combination with a speed profile for the at least one other vehicle, so that operational data comprise this speed profile. Thus, conclusions regarding, for example, gear selection may be drawn. If, for example, the other vehicle has been driven a major portion of the time, for example, approx. 80% of the time, at a high speed, for example, approx. 89 km/h, the conclusion that the vehicle has during this time used a highest gear may be drawn if the period during which the engine speed for the other vehicle was around cruise speed represents approx. 80% of the time. The engine speeds and the cruise speeds used may be deduced from the load matrix.

Figure 2A:
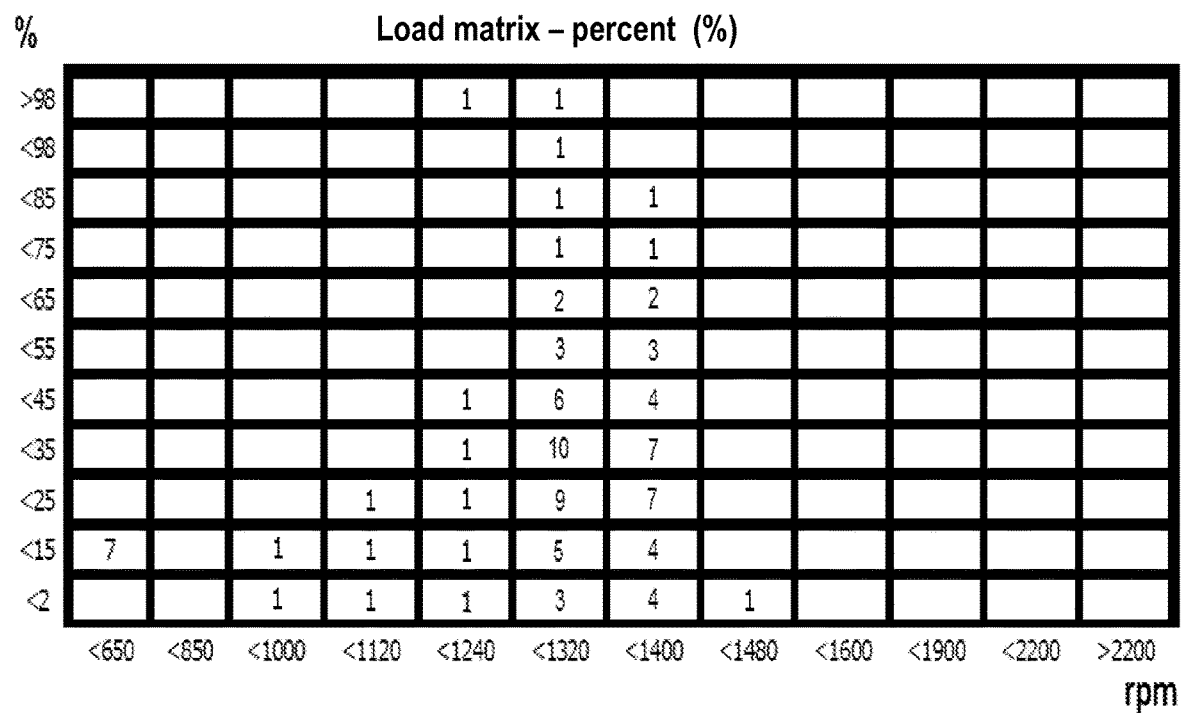
FIG. 2a shows an example of a load matrix.

FIG. 2a shows a non-limiting example of such a load matrix. Along the X shaft, the revolutions are provided, as the engine speed, and along the Y shaft the torque is provided, as the engine torque, which has been submitted at the respective engine speed in relation to a maximum torque, in other words as a percentage of the maximum torque. The maximum engine torque may be different at different revolutions. At different/certain engine speeds (X shaft) and different/certain torques (Y shaft) the vehicle thus has been operating for a number of hours t, where the value for t for the fields in the load matrix may be normalized with regard to all fields in the load matrix, through which a normalized load matrix is obtained. The value t for the fields is calculated by the vehicle saving values within a torque area, for example, 85-98% of the maximum engine torque, and within an engine speed area, for example, 1,240-1,320 rpm.

The load matrix is used according to the embodiment to determine the speeds at which the vehicle has been travelling, following which the gear usage may be determined based on these speeds.

The speed may be calculated based on an engine speed revs collected from the load matrix as per:

$$v = \frac{revs * \pi r_{wheel} * 3,6}{30 * U_{gearbox} U_{rearshaft}}, \tag{equ. 1}$$

revs is the engine speed from the load matrix;
$r_{wheel}$ is the wheel radius;
$U_{rearshaft}$ is a gearing for the rear shaft; and
$U_{gearbox}$ is a gearing for the gearbox.

The speed v may thus here be determined based on operational data. Gears used and the utilisation period for these gears may then be determined based on these speed operational data and knowledge about the vehicle's gearbox and/or gear system.

Operational data may, according to one embodiment, also be provided to the system in the form of at least one energy use/consumption matrix, where the at least one energy consumption matrix comprises values corresponding to energy consumption for the at least one other vehicle at different/certain speeds and different/certain torques.

Figure 2B:
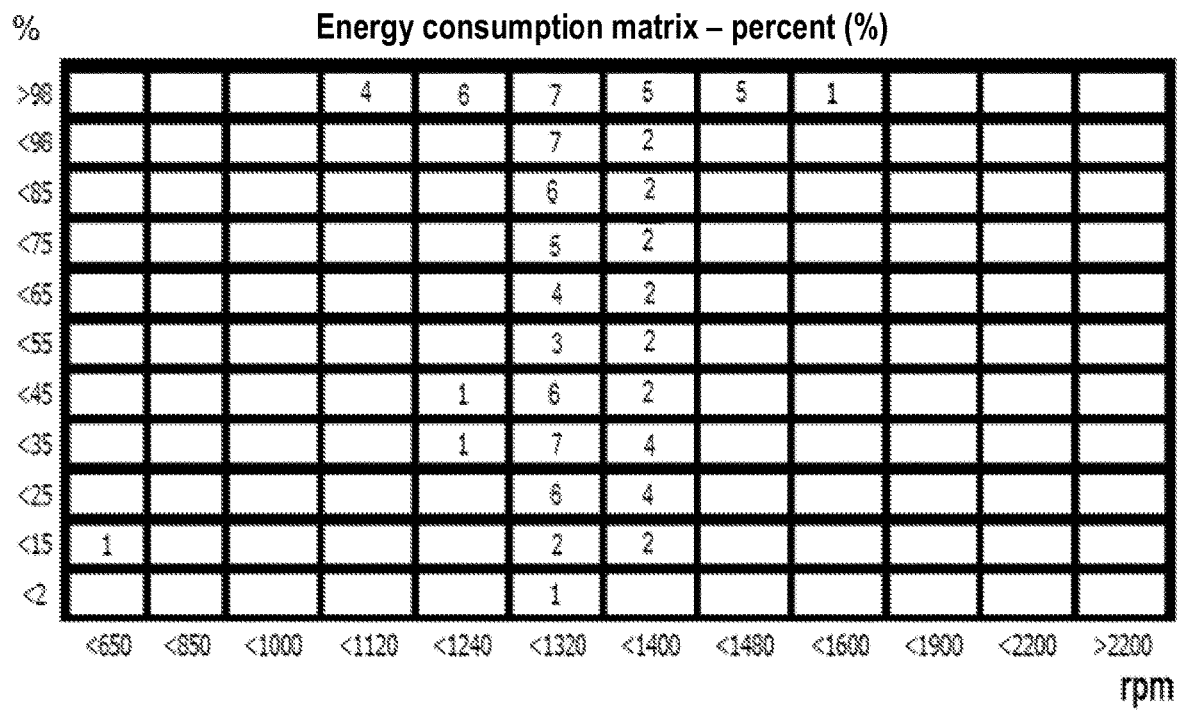
FIG. 2b shows an example of an energy consumption matrix.

FIG. 2b shows a non-limiting example of such an energy consumption matrix. Along the X shaft, the engine speed is provided, for example, an engine speed, and along the Y shaft the torque is provided, for example, an engine torque, which has been submitted at the respective engine speed in relation to a maximum torque, in other words as a percentage of the maximum torque. The maximum torque may be different at different engine speeds. At different/certain engine speeds (the X shaft) and different/certain torques (the Y shaft) the vehicle thus has had an energy consumption, where the values for the fields in the energy consumption matrix may be normalized with respect to all fields in the energy consumption matrix, so that a normalized of the energy consumption matrix is obtained. The value for the fields is calculated by the vehicle saving values within a torque area, for example, 85-98% of the maximum torque, and within an engine speed area, for example, 1,240-1,320 rpm.

Operational data may further comprise a utilisation period for the respective at least one engine speed which is provided to a gearbox in the at least one other vehicle. Here, the operational data specify a description of which engine speeds that have been used by the other vehicle and how long these different/certain engine speeds have been used in the at least one other vehicle.

The operational data may further comprise a utilisation period for the respective at least one engine speed which is provided to the gearbox 103 in the at least one other vehicle, i.e. a description of which engine torques have been used and for how long these engine torques were used.

The operational data may further comprise at least one fuel consumption for the engine 101 in the at least one other vehicle.

The operational data may further comprise at least one driving force in at least one wheel in the at least one other vehicle, i.e. the driving force which is used in one or several wheels in the at least one other vehicle. A conversion between engine torque and driving force may be carried out according to:

$$F_{driv} = \frac{U_{rearshaft}\left(\begin{array}{c}(T_{engine} - T_{lretarder}) - \\ U_{gearbox}[(T]_{lgearbox} - T_{lrearshaft})\end{array}\right)}{r_{wheel}},$$ (equ. 2)

where
$U_{rear\ shaft}$ is a gearing for the rear shaft;
$U_{gearbox}$ is a gearing for the gearbox.
$T_{engine}$ is the engine torque;
$T_{l\ retarder}$ is the loss torque for a retarder;
$T_{l\ gearbox}$ is the loss torque for the gearbox;
$T_{l\ rear\ shaft}$ is the loss torque for the rear shaft; and
$r_{wheel}$ is the wheel radius.

Driving force may here thus be determined based on operational data. Engine torque $T_{engine}$ may here be obtained from the load matrix. The retarder may be arranged before or after the gearbox on the driveline.

According to one embodiment, losses in the driveline for two different vehicles, or for two different vehicle specifications, may be simulated based on the speeds and the driving forces. These losses may then be compared mutually.

According to one embodiment, the system thus comprises, according to the present invention, a conversion device which is arranged to convert operational data to corresponding forces. For this embodiment, the simulation device is arranged to use these corresponding forces in the simulations.

The operational data may further comprise a utilisation period for the respective at least one engine torque per used gear in the at least one other vehicle, i.e. a description of which engine torques have been used for the different gears and for how long these engine torques were used. This embodiment provides a good resolution for the engine torque since it is divided per gear.

The operational data may further comprise at least one loss for a driveline in the at least one other vehicle.

The operational data may further comprise at least one road inclination α and at least one vehicle speed for road sections where the at least one other vehicle has been used, typically for road sections along routes where the first vehicle is planned to be used. Based on the road inclination α and the speed, the driving resistance may be calculated, i.e. the forces that brake the vehicle's progress.

Figure 3:
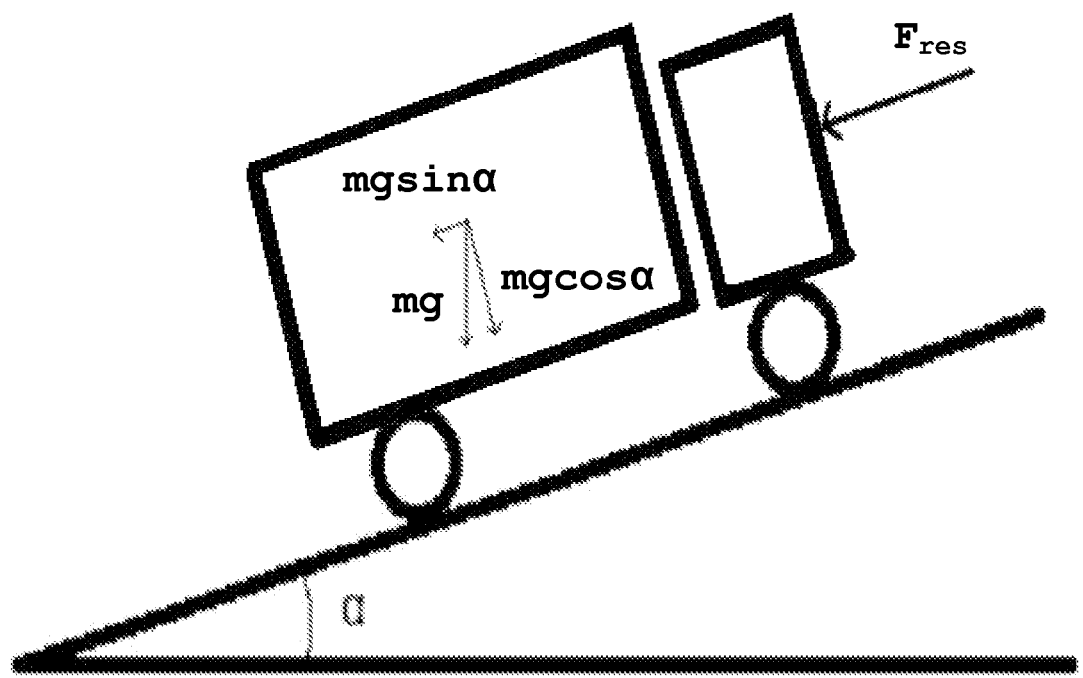
FIG. 3 shows a driving resistance for an example vehicle on an uphill slope.

FIG. 3 shows a schematic view of a vehicle which is travelling on a road section with a road inclination α and forces that impact the vehicle. The driving resistance $F_{res}$ for this non-limiting example may, for example, be calculated according to:

$$F_{res} = F_{air} + F_{roll} + F_{clim},$$ (equ. 3)

where
$F_{air}$ is the air resistance;
$F_{roll}$ is the rolling resistance; and
$F_{clim}$ is the climbing resistance.

The air resistance, $F_{air}$ may be calculated according to:

$$F_{air} = \frac{1}{2}C_d \rho A v^2,$$ (equ. 4)

where
$C_d$ is an air resistance coefficient;
ρ is air density, which depends on the outdoor temperature and elevation;
A is a cross sectional area for the vehicle; and
v is the vehicle speed.

The rolling resistance $F_{roll}$ may be calculated with a formula that uses a static coefficient and a speed-dependent coefficient, which is multiplied by a normal force of the wheels.

$$F_{roll} = mg \cos(\alpha)(C_{r1} + C_{r2} v)$$ (equ. 5)

where
m is the total weight of the vehicle;
g is the gravitational constant;
α is the inclination angle of the road;
$C_{r1}$ is the static rolling resistance coefficient;
$C_{r2}$ is the speed-dependent rolling resistance coefficient; and
v is the vehicle speed The climbing resistance $F_{clim}$ arises when the vehicle drives on an incline. The climbing resistance $F_{clim}$ is the force component from the gravitation force which is parallel to the road surface. The climbing resistance $F_{clim}$ may be calculated according to:

$$F_{clim} = mg \sin \alpha,$$ (equ. 6)

where
m is the total vehicle weight;
g is the gravitational constant; and
α is the road's inclination angle.

The operational data may further comprise at least one elevation above sea level for places where the at least one other vehicle has been used. Thus a characteristic for the turbocharger may be determined. For example, there are turbochargers which are specially adapted for use at high altitudes, which may be selected in the vehicle specifications. Engine characteristics may also be determined based on at least one elevation above sea level since different engines are suitable to different extents for different elevations above sea level.

According to one embodiment of the invention, operational data comprise a vehicle load for the other vehicle. The simulation may be based on the vehicle load together with the speed for the other vehicle. The vehicle load may here preferably be stored as a vehicle load per speed in order to be used easily for simulations.

Apart from being based on operational data, the systematic selection of the vehicle specifications may according to one embodiment also be based on supporting information/ data. Thus, correct loss models for, for example, the gearbox and the rear shaft may be obtained, providing more exact simulations and also a correct loss model for the first vehicle. Thus, the loss model for the first vehicle does not need to be corrected.

Such supporting data consist of, according to one embodiment, time for acceleration and/or time for retardation, which jointly with other operational data means that the system according to the present invention may carry out more exact and/or more comprehensive simulations. For example, a time when an acceleration/retardation has been within a first interval, and/or a time when an acceleration/retardation has been within a second interval, may be stored and used as supporting data. Thus, a higher accuracy may be obtained and/or more ratios may be prepared in connection with the simulation. If the retardation is used, calculations of energy storage may also be made. For example, how much energy that is braked away may then be calculated. Subsequently, this energy which has been braked away may be compared to the vehicle's energy storage capacity to store this energy. For example, the energy may be compared to a capacity which the vehicle's batteries have to store this energy with the help of one or several generators. Different generators may provide different effects for storage of the energy resulting from accelerations/retardations within the first and/or second intervals.

Such supporting data consist of, according to one embodiment, the retarder data, comprising the torque, the engine speed and temperature, where energy storage calculations and/or calculations of brake wear may be carried out.

Such supporting data consist of, according to one embodiment, data related to an outdoor temperature, which may be used in order to determine, with the help of a loss model, the density of the air and a catalyst temperature, which in turn controls the choice of an engine clam and thus the fuel consumption. The catalyst temperature is here impacted by the outdoor temperature. Injection strategies for the engine and thus the engine clam are controlled based on the catalyst temperature, since the catalyst temperature impacts the amount of nitrogen oxides $NO_x$ that are emitted. The outdoor temperature may also be used to determine the performance of a turbo.

Such supporting data consist of, according to the one embodiment, data related to a gearbox temperature and/or oil temperature, which may be used to determine gearbox wear. If there is extensive wear, cooling may be required. If there is little wear, less cooling may be sufficient.

Such supporting data consist of, according to one embodiment, data related to a consumed fuel amount, which may be used to correct an absolute level for the calculations. If it is known, for example, that a new vehicle consumes a certain percentage less fuel than an old vehicle, the absolute level for the consumption value of the old vehicle may be adjusted by this percentage.

Such supporting data consist of, according to one embodiment, at least one elevation above sea level, which may be used as a complement of operational data in order to select a turbocharger, since there are turbochargers which are specifically adapted for use at certain defined elevations above sea level.

A person skilled in the art will realize that the systematic selection of vehicle specifications according to the present invention may also be implemented in a computer program, which when executed in a computer will cause the computer to carry out the method. The computer program usually consists of a part of a computer program product 403, where the computer program product comprises a suitable digital storage medium on which the computer program is stored. The said computer readable medium consists of a suitable memory, for example: ROM (Read-Only Memory), PROM (Programmable Read-Only Memory), EPROM (Erasable PROM), Flash, EEPROM (Electrically Erasable PROM), a hard disk device, etc.

Figure 4:
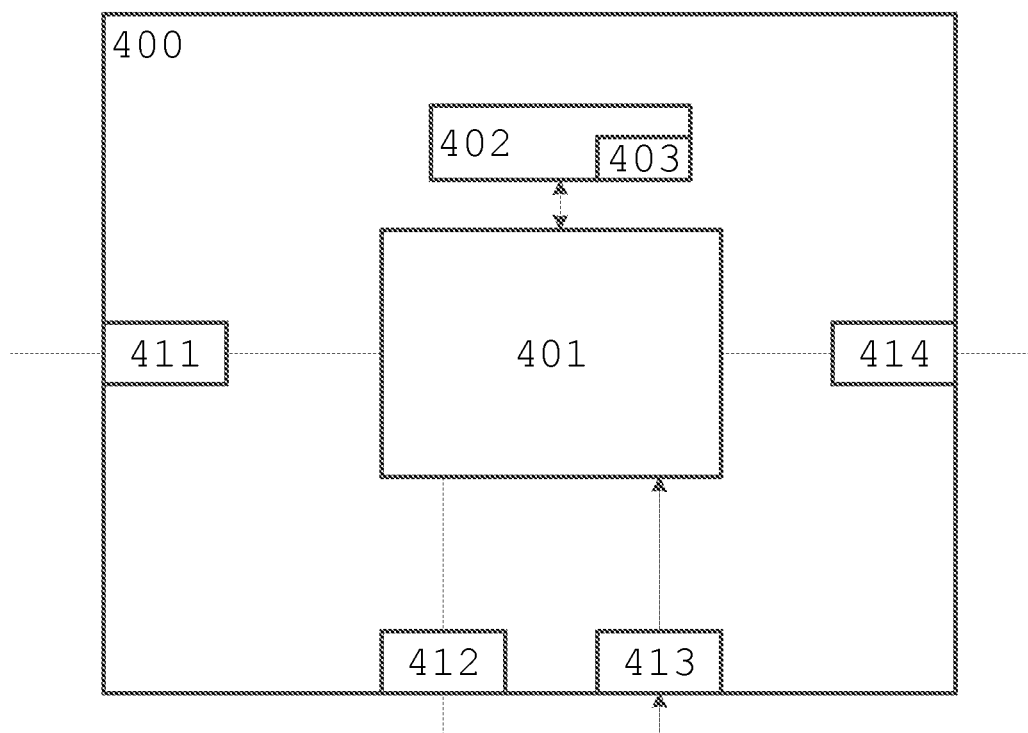
FIG. 4 shows a control device according to the invention.

FIG. 4 shows schematically a control device 400. The control device 400 comprises a calculation device 401, which may consist of essentially a suitable type of processor or microcomputer, e.g. a circuit for digital signal processing (Digital Signal Processor, DSP), or a circuit with a specific function (Application Specific Integrated Circuit, ASIC). The calculation device 401 is connected to a memory unit 402 installed in the control device 400, which provides the calculation device 401 with e.g. the stored program code and/or the stored data which the calculation device 401 needs in order to be able to carry out calculations. The calculation device 401 is also set up to store interim or final results of calculations in the memory device 402.

Further, the control device 400 is equipped with devices 411, 412, 413, 414 for receiving and sending of input and output signals, respectively. These input and output signals may contain wave shapes, pulses, or other attributes, which may be detected by the devices 411, 413 for the receipt of input signals as information and may be converted into signals that may be processed by the calculation device 401. These signals are then provided to the calculation device 401. The devices 412, 414 for sending of output signals are arranged to transform signals received from the calculation device 401 for the creation of output signals by, for example, modulating the signals, which may be transmitted to other parts of and/or systems in the vehicle.

Each one of the connections to the devices for receipt and sending of input and output signals may consist of one or several of a cable; a data bus, such as a CAN (Controller Area Network) bus, a MOST (Media Oriented Systems Transport) bus, or any other bus configuration; or of a wireless connection. A person skilled in the art will realise that the above mentioned computer may consist of the calculation device 401 and that the above mentioned memory may consist of the memory device 402.

Generally, control systems in modern vehicles consist of a communications bus system consisting of one or several communications buses to connect a number of electronic control devices (ECUs), or controllers, and different components localised on the vehicle. Such a control system may comprise a large number of control devices, and the responsibility for a specific function may be distributed among more than one control device. Vehicles of the type shown thus often comprise significantly more control devices than as shown in FIG. 4, which is well known to a person skilled in the art within the technology area.

The present invention is implemented in the embodiment displayed in the control device 400. The invention may also be implemented wholly or partly in one or several other control devices already existing in the vehicle or a control device dedicated to the present invention.

A person skilled in the art will also realize that the above system may be modified according to the different embodiments of the method according to the invention. In addition, the invention pertains to a motor vehicle 1, for example a truck or bus, comprising at least one system for the systematic selection of vehicle specifications according to the invention.

The present invention is not limited to the embodiments of the invention described above, but pertains to and comprises all embodiments within the protected scope of the enclosed independent claims.

The invention claimed is:

1. A system that carries out a systematic selection of a specification for a first vehicle, the specification including a number of parameters related to at least one characteristic for the first vehicle, the system comprising:
   a collection device that collects parameter values and operational data from at least one other vehicle, the other vehicle being a used vehicle, the operational data comprising information about performance of the at least one other vehicle under route conditions of a route while the at least one other vehicle was driven along the route, and each parameter value being related to a vehicle characteristic;
   a simulation device that performs different simulations of expected performance of the first vehicle based on the operational data and the parameter values collected from the at least one other vehicle by the collection device by changing, for each simulation, a first parameter value and a second parameter value from the parameter values to obtain the different simulations, and comparing the results of the different simulations to determine the impact of the changes on at least one characteristic for the first vehicle; and
   a selection device that selects at least one specification for the first vehicle based on the different simulations,
   wherein the at least one characteristic is a vehicle characteristic from a group consisting of: a gearing for a rear shaft; a gearbox; an engine; a clutch; a brake system; a turbocharger; a wheel type; a distribution gearbox; a battery; and an exhaust purification system.

2. The system according to claim 1, wherein the system is configured to select the at least one other vehicle, so that the at least one other vehicle has been used in an essentially similar manner as planned for the first vehicle.

3. The system according to claim 1, wherein the operational data comprises information about how two or more other vehicles have been used.

4. The system according to claim 1, wherein the operational data further include at least one load matrix, the at least one load matrix comprising values corresponding to time periods during which the at least one other vehicle has used certain revolutions and certain torques.

5. The system according to claim 1, wherein the operational data further comprise at least one energy consumption matrix, the at least one energy consumption matrix comprising values corresponding to energy consumption for the at least one other vehicle at certain revolutions and certain torques.

6. The system according to claim 1, wherein the operational data further comprise information related to at least one use of the at least one other vehicle from the group consisting of:
   a utilisation period for the respective at least one gear in a gearbox in the at least one other vehicle;
   a utilisation period for the respective at least one engine speed which is provided to a gearbox in the at least one other vehicle;
   a utilisation period for the respective at least one engine torque which is provided to a gearbox in the at least one other vehicle;
   a utilisation period for the respective at least one engine torque per used gear for a gearbox in the at least one other vehicle;
   at least one fuel consumption for an engine in the at least one other vehicle;
   at least one driving power for at least one wheel in the at least one other vehicle;
   at least one loss for a driveline in the at least one other vehicle;
   at least one road inclination and at least one vehicle speed for road sections where the at least one other vehicle has been used; and
   at least one elevation above sea level for places where the at least one other vehicle has been used.

7. The system according to claim 1, further comprising a conversion device arranged to convert the operational data into corresponding force values, wherein the simulation device is arranged to use the corresponding force values in the simulation.

8. The system according to claim 1, wherein the collection device:
   receives input identification information for the at least one other vehicle;
   identifies the at least one other vehicle based on the identification information;
   and collects the operational data.

9. The system according to claim 8, wherein the identification information comprises one identification from the group consisting of:
   a chassis number; and
   a registration number.

10. The system according to claim 1, wherein the simulation device:
    includes in the at least one other simulation value several other simulation values, wherein each one of the several other simulation values is calculated based on a respective one other parameter value;
    compares the first simulation value and the several other simulation values during the comparison;
    identifies a predetermined number of specifications as potentially suitable specifications based on the comparison; and
    indicates the predetermined number of potentially suitable specifications.

11. The system according to claim 1, wherein the first simulation value and the at least one other simulation value are related to at least one factor from the group consisting of:
    fuel consumption;
    driveability;
    component life; and
    energy storage.

12. The system according to claim 8, wherein the operational data are provided to the collection device from the group consisting of:
   the at least one other vehicle; and
   a database, which is arranged to store operational data from the at least one other vehicle.

13. The system according to claim 1, wherein the simulation device is arranged to base the simulation on at least one value or values from the group consisting of:
   acceleration and time;
   retardation and time;
   retarder data;
   vehicle load;
   outdoor temperature;
   gearbox temperature;
   oil temperature;
   elevation above sea level; and
   amount of fuel consumed.

14. The system according to claim 1, wherein the route conditions include at least one of speed limits on the route, topograph, for the route, road conditions for the route, and driving resistance for the route.

* * * * *